(12) United States Patent
Morita et al.

(10) Patent No.: US 8,525,418 B2
(45) Date of Patent: Sep. 3, 2013

(54) ELECTROSTATIC CHUCK

(75) Inventors: Naotoshi Morita, Kani (JP); Ryosuke Kameyama, Aichi (JP)

(73) Assignee: NGK Spark Plug Co., Ltd., Aichi (JP)

( * ) Notice: Subject to any disclaimer, the term of this patent is extended or adjusted under 35 U.S.C. 154(b) by 1408 days.

(21) Appl. No.: 11/392,768

(22) Filed: Mar. 30, 2006

(65) Prior Publication Data

US 2006/0221539 A1 Oct. 5, 2006

(30) Foreign Application Priority Data

Mar. 31, 2005 (JP) .............................. P. 2005-104520

(51) Int. Cl.
*H01J 7/24* (2006.01)

(52) U.S. Cl.
USPC .............. 315/111.21; 219/121.4; 219/121.54; 219/390; 219/405

(58) Field of Classification Search
USPC ................... 219/390, 405, 411, 444.1, 460.1, 219/461.1, 468.1; 392/416, 418; 118/724, 118/725
See application file for complete search history.

(56) References Cited

U.S. PATENT DOCUMENTS

| | | | |
|---|---|---|---|
| 5,191,506 A * | 3/1993 | Logan et al. | 361/234 |
| 6,108,190 A | 8/2000 | Nagasaki | |
| 6,225,606 B1 | 5/2001 | Tsuruta et al. | |
| 6,608,745 B2 | 8/2003 | Tsuruta et al. | |
| 6,646,233 B2 * | 11/2003 | Kanno et al. | 219/390 |
| 6,825,617 B2 * | 11/2004 | Kanno et al. | 315/111.21 |
| 2003/0075537 A1 * | 4/2003 | Okajima et al. | 219/444.1 |
| 2003/0160042 A1 | 8/2003 | Hiramatsu et al. | |
| 2004/0108308 A1 * | 6/2004 | Okajima | 219/468.1 |
| 2004/0175549 A1 | 9/2004 | Ito | |
| 2005/0152089 A1 * | 7/2005 | Matsuda et al. | 361/234 |

FOREIGN PATENT DOCUMENTS

| | | |
|---|---|---|
| JP | 11-163109 A | 6/1999 |
| JP | 2002-359281 A | 12/2002 |
| JP | 2004-31599 | 1/2004 |
| JP | 2004-71647 | 3/2004 |
| JP | 2005-26120 | 1/2005 |
| KR | 10-0281954 B1 | 11/2000 |
| KR | 10-2004-0030803 A | 4/2004 |
| WO | 01/78455 A1 | 10/2001 |

* cited by examiner

*Primary Examiner* — Brian Jennison
(74) *Attorney, Agent, or Firm* — Sughrue Mion, PLLC

(57) ABSTRACT

An electrostatic chuck including a metal base having a through hole; a ceramic body covering the through hole; a suction electrode provided in the ceramic body; and a heating element provided in the ceramic body. A projection region defined by projecting the through hole toward the ceramic body is differentiated from an outer region which is determined by magnifying the projection region at a similarity ratio of three while setting an areal center of gravity of the projection region as a center of similarity, but excluding an interior of the projection region. Furthermore, the heating element is arranged such that a heating value per unit area in the projection region is 50% or less of a heating value per unit area in the outer region.

15 Claims, 9 Drawing Sheets

ELECTROSTATIC CHUCK

BACKGROUND OF THE INVENTION

1. Field of the Invention

The present invention relates to an electrostatic chuck which is useful, for example, in fixing, flatness correction and transporting a semiconductor wafer in an apparatus adapted for fabricating a semiconductor wafer, such as an etching apparatus, an ion implanter, or an electron beam exposing apparatus.

2. Description of the Related Art

In a semiconductor production apparatus or the like, conventionally, an electrostatic chuck is used in conjunction with a process such as dry etching, warpage correction, or transporting a semiconductor wafer while fixing the wafer to the chuck via a vacuum.

In a known electrostatic chuck of this kind, a disk-like ceramic body having an embedded suction electrode and a disk-like aluminum base are joined and integrated with one another. Also, an electrostatic chuck in which a heating element is embedded in a ceramic body for the purpose of heating a semiconductor wafer is known (see JP-A-2004-71647 (page 4, FIG. 1)).

An electrostatic chuck having such a heating element must have a uniform surface temperature distribution which heats a semiconductor wafer in order to enhance processing accuracy. Namely, when there is a temperature variation within a semiconductor wafer, processing accuracy, for example, of etching is lowered, and hence the entire face of the semiconductor wafer desirably is uniformly heated by the heating element.

3. Problems to be Solved by the Invention:

In the above-mentioned aluminum base, as shown in FIGS. 10A and 10B, a through hole P3 which passes in the thickness direction is formed, for example, to dispose terminals for supplying current to the suction electrode P1 and the heating element P2. The aluminum base P4 is not in direct contact with the ceramic body P5 in the portion of the through hole P3, which can result in non-uniform heating.

For example, a method in which, in order to instantaneously change the temperature of the ceramic body P5 during an etching process, the ceramic body P5 generates heat and at the same time the aluminum base P4 is cooled will be considered. In this method, the temperature of the ceramic body P5 is locally raised by heating element P2, in the portion of the through hole P3 where the aluminum base P4 is not in direct contact with the ceramic body P5. Consequently, a problem arises in that the temperature distribution in the ceramic body P5 deteriorates (i.e., is made non-uniform).

SUMMARY OF THE INVENTION

The invention has been achieved in order to solve the above-noted problems of the prior art. It is therefore an object of the present invention to provide a heated electrostatic chuck including a ceramic body providing a uniform temperature distribution.

(1) According to a first aspect of the invention, the electrostatic chuck comprises a metal base having a through hole and a ceramic body covering the through hole, and a suction electrode and a heating element provided in the ceramic body, wherein a projection region which is defined by projecting the through hole of the metal base toward the ceramic body is differentiated from an outer region which is determined by magnifying the projection region at a similarity ratio of three while setting an areal center of gravity of the projection region as a center of similarity, but excluding an interior of the projection region, said heating element imparting a heating value per unit area in the projection region that is 50% or less of a heating value per unit area in the outer region.

The invention provides an electrostatic chuck including a ceramic body having an improved configuration. The ceramic body is integrated with a metal base having a higher thermal conductivity than that of the ceramic body. An object to be processed or worked (workpiece) such as a semiconductor wafer can be fixed to the electrostatic base by means of an electrostatic attractive force, and heated by means of the heating element.

In the invention, particularly, the heating element provided in the ceramic body imparts a heating value per unit area in the projection region of 50% or less of the heating value per unit area in the outer region. As a result, the temperature of the ceramic body in the portion (projection region) corresponding to the through hole is not excessively raised.

In order to instantaneously change the temperature of the ceramic body during an etching process, for example, the ceramic body generates heat and at the same time the metal base (e.g., aluminum base) is cooled. In that case, the heat of the ceramic body in a through hole where the metal base is not in direct contact with the ceramic body is hardly transmitted toward the metal base, and hence the ceramic body in the projection region of the through hole is susceptible to local temperature increases. In the invention, by contrast, the heating value of the projection region of the through hole is smaller than that of the outer region which is on the side of the outer circumference, and therefore the temperature rise of the projection region is lessened.

Therefore, the temperature of the ceramic body in the projection region of the through hole is not locally increased, and hence the temperature distribution in the ceramic body (particularly, the temperature distribution at the surface of the ceramic body on the side of a workpiece) can be made uniform. As a result, the whole workpiece can be uniformly heated, and processing accuracy and the like of the workpiece are advantageously improved.

The areal center of gravity means the center of gravity of the projection region when the projection region is viewed in the projection direction. In the case where the projection region of the through hole is a circle of diameter T, for example, the outer region is an annular region having an outer diameter of 3T and which is formed by eliminating the projection region from a circle that is concentric with the projection region.

Examples of the metal base and the ceramic body are plate-like members. An example of the through hole is a through hole which passes through the metal base in the thickness direction. In the case where the through hole is covered by the ceramic body, the whole area of an opening portion of the through hole on the side of the ceramic body may be covered, or a part of the area may be covered.

(2) According to a second aspect of the invention, the heating element in the projection region and the outer region are formed of substantially the same material, have substantially the same thickness, and have substantially the same width, and a per unit area (occupancy rate) of the heating element in the projection region is 50% or less of a per unit area (occupancy rate) of the heating element in the outer region. As used to define occupancy rate, "area" means "lateral surface area."

The invention is exemplified for the case where heating elements in the projection region and the outer region are identical in material and shape, but different in occupancy rate of the heating element (area of the heating element per unit area of the projection region or the outer region).

(3) According to a third aspect of the invention, the electrostatic chuck comprises: a metal base having a through hole; a ceramic body covering the through hole; a suction electrode provided in the ceramic body; and a heating element provided in the ceramic body, wherein the heating element is not present in a projection region defined by projecting said through hole toward said ceramic body.

In the invention, the heating element is arranged in the ceramic body so as to avoid the projection region which is formed by projecting the through hole toward the ceramic body. Therefore, the temperature of the ceramic body in the portion (projection region) corresponding to the through hole is not excessively raised.

As described above, in the method in which the ceramic body generates heat and at the same time the metal base is cooled, the heat of the ceramic body in a through hole where the metal base is not in direct contact with the ceramic body is hardly transmitted toward the metal base. Hence the ceramic body in the projection region of the through hole is susceptible to local temperature increases. In the invention, in contrast, the heating element is not present in the projection region of the through hole, and therefore the temperature rise of the projection region is lessened.

Consequently, the temperature distribution in the ceramic body can be made uniform. As a result, the whole workpiece can be uniformly heated, and processing accuracy and the like of the workpiece are advantageously improved.

(4) According to a fourth aspect of the invention, the heating element linearly extends in a lateral direction (i.e., within the same lateral plane), and the heating element in the vicinity of the projection region has a substantially U-like shape. Furthermore, a convex side of the U-like shape is on the side of the projection region.

In the invention, in the case where the linear heating element is provided near the projection region, the heating element in the vicinity of the projection region is arranged so as to be bent into a substantially U-like shape. Therefore, the heating element can be arranged so as to avoid the projection region, and so as to be absent in a spot-like manner.

As a method of arranging the heating element so as to avoid the projection region, usually, a heating element may be contemplated which, while normally passing through the projection region or in the vicinity thereof, is shifted in a widthwise direction. When this method is employed, there is a possibility that, in the shifted portion (depending on the degree of shifting), the heating element is densely provided and the temperature is raised. Such a possibility does not arise in practice of the fourth aspect of the invention.

(5) According to a fifth aspect of the invention, the heating element is separated from the projection region by 1 mm or more.

In the invention, the heating element is provided with sufficient separation from the projection region. Therefore, the temperature distribution in the ceramic body can surely be made uniform.

(6) According to a sixth aspect of the invention, the ceramic body is integrated with the metal base.

The invention provides an electrostatic chuck in which the ceramic body and the metal base are integrated by bonding or the like.

(7) According to a seventh aspect of the invention, the ceramic body is made of alumina.

The invention is exemplified in terms of a preferred material (i.e., alumina) of the ceramic body. Aluminum nitride, yttria, or the like may also be used.

BRIEF DESCRIPTION OF THE DRAWINGS

FIG. 3A is a longitudinal sectional view of the electrostatic chuck, and FIG. 3B is a diagram showing a planar arrangement of a heating element and the like.

FIG. 8A is a sectional view taken along the line B-B in FIG. 8B, and FIG. 8B is a diagram showing a planar arrangement of a heating element and the like.

DESCRIPTION OF REFERENCE NUMERALS AND SIGNS

Figure 1:
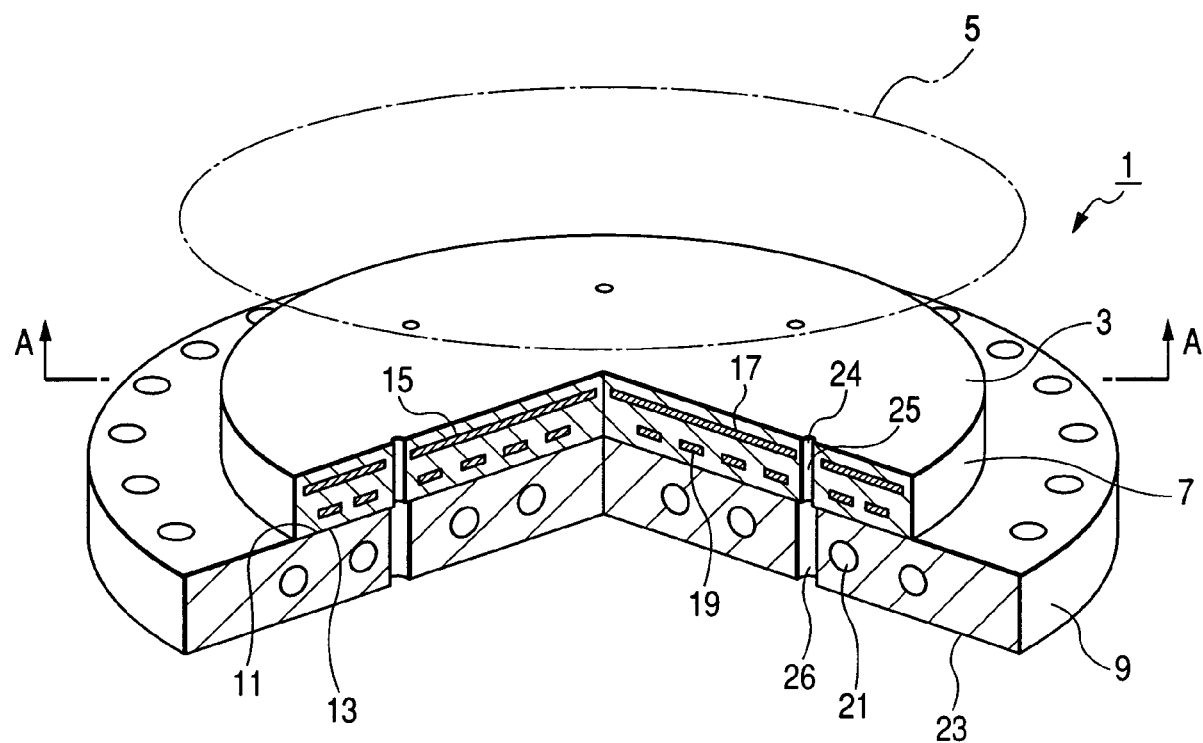
FIG. 1 is a partial cutaway perspective view of an electrostatic chuck of Embodiment 1.

Reference numerals used to identify various structural features shown in the drawings including the following.

1, 101, 135, 150, 161 . . . electrostatic chuck
3 . . . chuck face
5 . . . semiconductor wafer
7, 105, 131, 157, 165 . . . ceramic body
9, 123, 137, 151 . . . aluminum base
15, 17, 117, 119 . . . internal electrode
19, 115, 141, 155, 163 . . . heating element
27, 28, 29, 31 . . . concave portion
24, 26, 33, 35, 37, 34, 61, 63, 65, 67, 69, 75, 77, 79, 121, 125, 139, 153 . . . through hole

DETAILED DESCRIPTION OF THE INVENTION

Next, the invention will be described in greater detail by reference to the drawings. However, the present invention should not be construed as being limited thereto.

Figure 2:
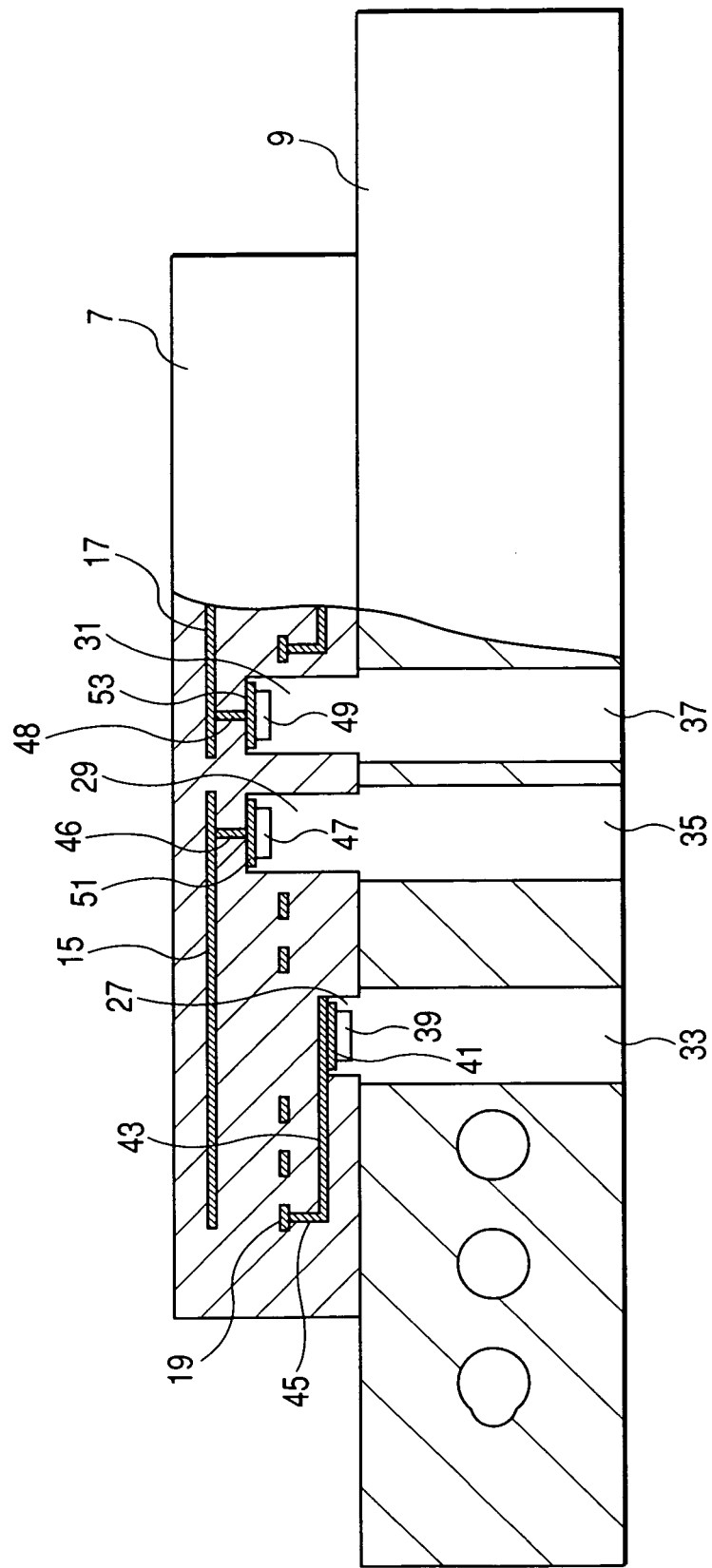
FIG. 2 is a diagram showing a section (longitudinal section) of the electrostatic chuck of Embodiment 1 taken along the line A-A.

Embodiment 1 a) First, the structure of an electrostatic chuck of the embodiment will be described. FIG. 1 is a partially cutaway perspective view of the electrostatic chuck, and FIG. 2 is a diagram showing a section of the electrostatic chuck taken along the line A-A of FIG. 1.

As shown in FIG. 1, in the electrostatic chuck 1 of the embodiment, a suction face (chuck face) 3 which is in the upper side of FIG. 1 can latch onto a semiconductor wafer 5 which is a to-be-heated object (workpiece), and a disk-like ceramic body 7 (for example, having a diameter of 300 mm×thickness of 3 mm) is bonded to a disk-like aluminum base 9 (for example, having a diameter of 340 mm×thickness of 20 mm).

The ceramic body 7 and the aluminum base 9 are bonded and integrated via a silicone resin through their principal faces (in the vertical direction in the figure), i.e., in a state where the principal face (metal bonding face) 13 of the aluminum base 9 is opposed to the principal face (ceramic bonding face) 11 of the ceramic body 7 opposite the chuck face 3. Namely, the plate-like (disk-like) electrostatic chuck 1 is configured by integrating and stacking the members in the thickness direction, where the entire bonding face of the ceramic body 7 is bonded to the aluminum base.

In the ceramic body 7, a sintered alumina body is used as a base member, and the exposed surface side (the side opposite to the aluminum base 9) is the chuck face 3.

In the ceramic body 7, a pair of suction electrodes (electrostatic electrodes, internal electrodes) 15, 17 which are mainly made of tungsten are placed on the side of the chuck face 3, and a heating element 19 linearly extending in a lateral direction which is mainly made of tungsten is placed on the side of the aluminum base 9. The heating element 19 is spirally formed so as to cover the whole face (of the plane in which the heating element is placed) in a substantially uniform manner (see FIG. 4).

On the other hand, the aluminum base 9 has a larger diameter than the ceramic body 7 to allow the entire ceramic body 7 to be mounted on the base. A refrigerant flow path 21 which is used for cooling the aluminum base 9 is disposed in the aluminum base 9. The thermal conductivity of the aluminum base 9 is higher than that of the ceramic body 7.

In the electrostatic chuck 1, a cooling gas flow path 25 which extends from the chuck face 3 of the ceramic body 7 to the rear face (base face) 23 of the aluminum base 9, that is, which passes through the electrostatic chuck 1 in the thickness direction, is disposed at six positions of the aluminum base 9.

As enlargedly shown in FIG. 2, plural concave portions 27, 29, 31 which open toward the aluminum base 9, are disposed in portions of the ceramic body 7 on the side of the aluminum base 9. The concave portions 27 to 31 communicate with plural through holes 33, 35, 37 which pass through the aluminum base 9 in the thickness direction, respectively. The columnar concave portions 27, 29 and 31 have central axes in common with the columnar through holes 33, 35 and 37, respectively, and the inner diameters of the through holes 33, 35 and 37 are set to be larger than those of the concave portions 27, 29 and 31.

In the concave portion 27, a cylindrical internal connecting terminal 39 is joined to a metallization layer 41. The metallization layer 41 is (electrically) connected to one end of the heating element 19 through a conductive pattern 43 and a via 45. Also, another concave portion 28 (see FIG. 4) which is to be connected to the other end of the heating element 19, is formed in the same manner.

Figure 3A:
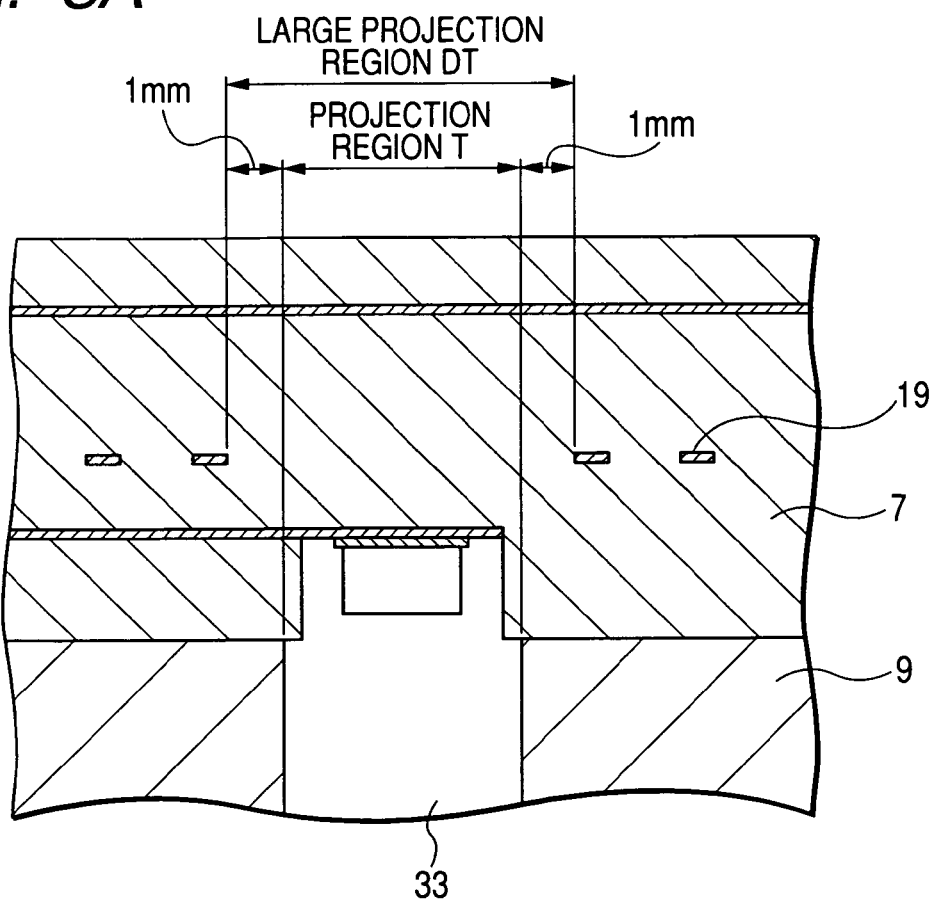
FIGS. 3A and 3B show enlarged main portions of the electrostatic chuck of Embodiment 1, where

In the concave portions 29, 31, cylindrical internal connecting terminals 47, 49 are joined to metallization layers 51, 53, respectively. The metallization layers 51, 53 are (electrically) connected to the internal electrodes 15, 17 through vias 46, 48, respectively.

b) Next, main portions of the electrostatic chuck 1 of the embodiment will be described. FIG. 3A is an enlarged sectional view showing main portions (for example, the vicinity of the concave portion 27) of the electrostatic chuck 1, FIG. 3B is a diagram showing a projection region of the through hole 33, and FIG. 4 is a plan view showing the pattern of the heating element 19.

As shown in FIG. 3A, in the embodiment, for example, the heating element 19 is placed so as to avoid a projection region T which is above (on the side of the ceramic body 7) the through hole 33 of the aluminum base 9.

Specifically, the heating element 19 is placed so as to avoid the interior of a region (large projection region DT) which is larger by 1 mm or more in a radial direction than the circular projection region T.

Figure 3B:
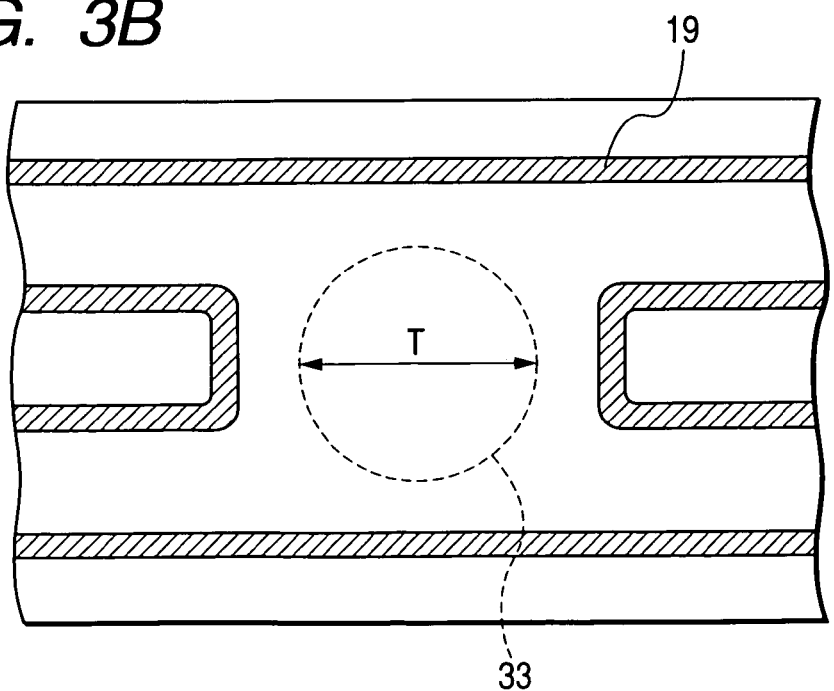
Figure 4:
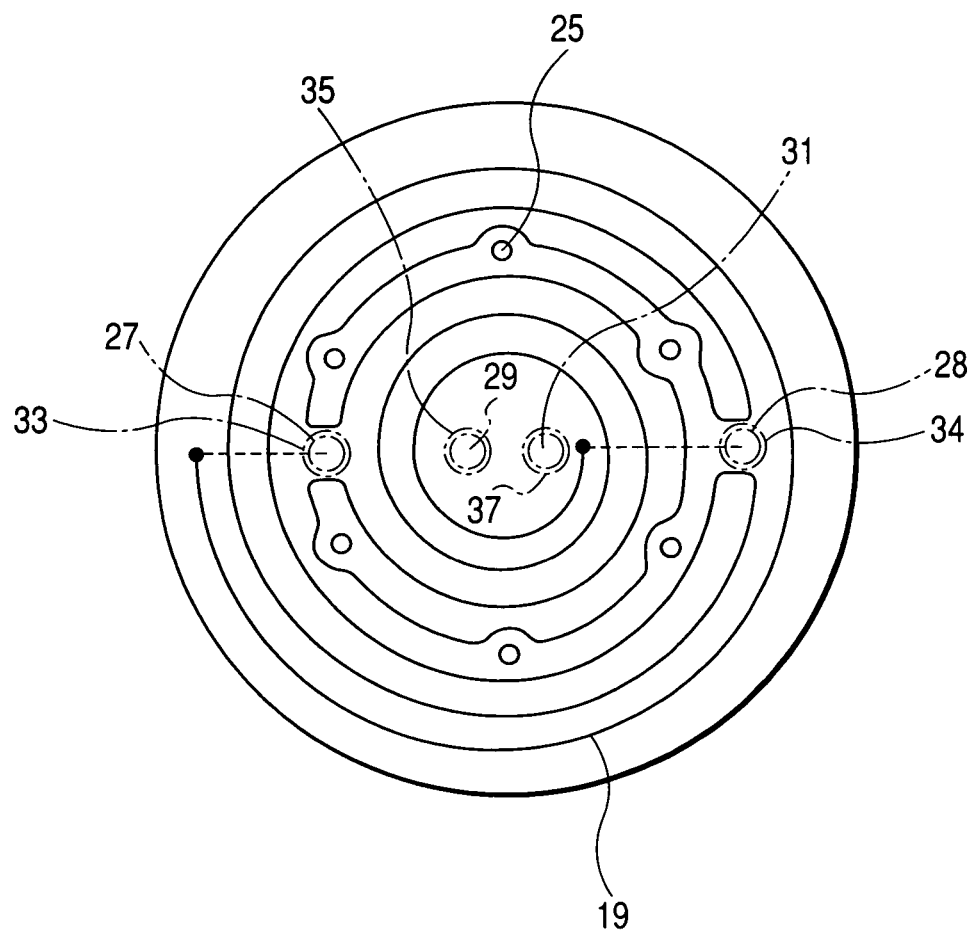
FIG. 4 is a diagram showing the pattern of the heating element in Embodiment 1.

As shown in FIG. 3B, the heating element 19 is arranged so as not to overlap with the projection region T, in such a manner that, in the upper and lower areas (in the figure) with respect to the projection region T, the heating element linearly extends in the lateral direction, but, in the lateral areas with respect to the projection region T, the heating element is bent bilaterally symmetrically into a substantially U-like shape (which is convex on the side of the projection region T) in the vicinity of the projection region T.

Therefore, the heating element 19 has an overall shape as shown in FIG. 4. Namely, the heating element 19 is arranged so as to avoid the pair of concave portions 29, 31 (for electrical connection of the internal electrodes-15, 17) located in a center portion, i.e., to avoid the through holes 35, 37 corresponding to the pair of concave portions 29, 31.

Furthermore, the heating element is arranged so as to avoid the pair of right and left concave portions 27, 28 (for electrical connection of the heating element 19), i.e., to avoid the through holes 33, 34 corresponding to the pair of concave portions 27, 28.

Figure 5:
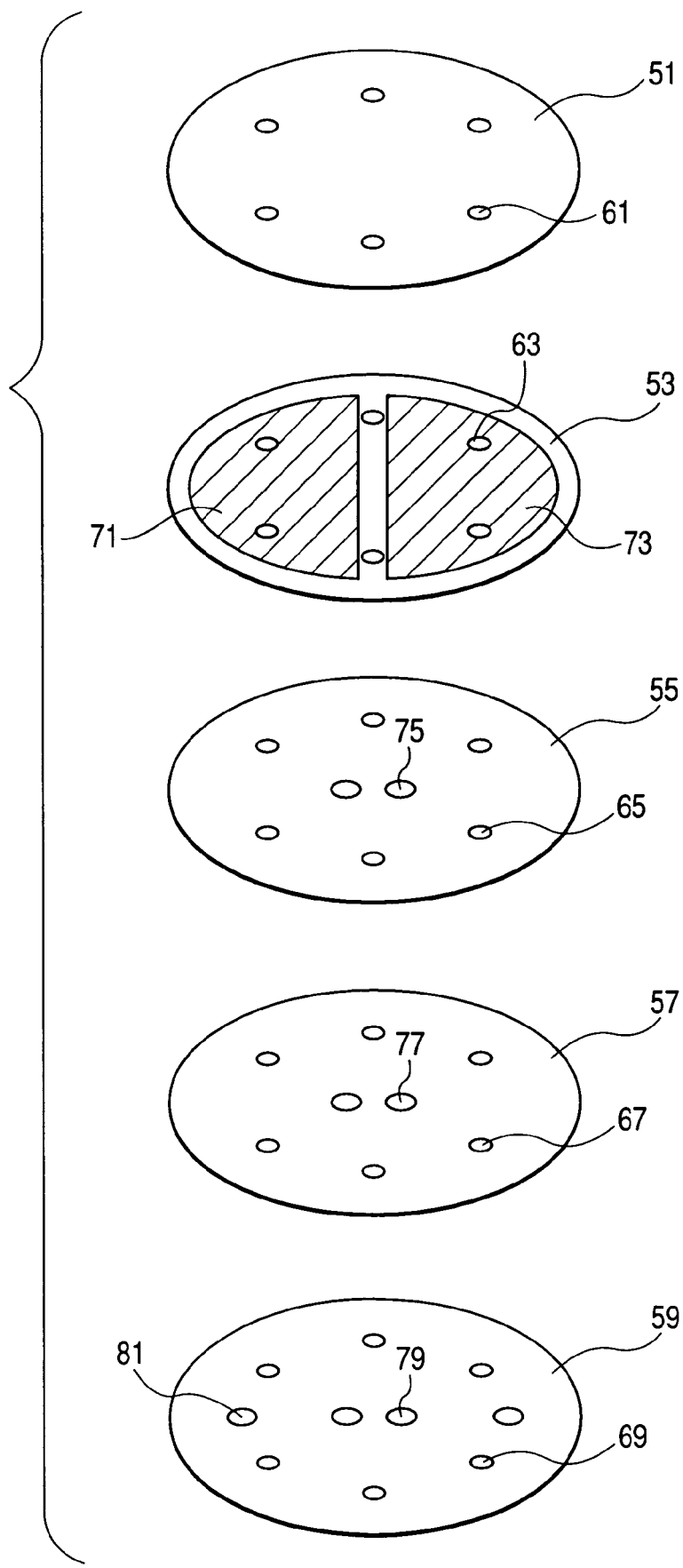
FIG. 5 is an exploded diagram showing a ceramic body in Embodiment 1.

Moreover, the heating element 19 is similarly arranged so as to avoid the cooling gas flow paths 25. As shown in FIG. 1, each of the cooling gas flow paths 25 is configured by a through hole 24 which passes through the ceramic body 7, and a through hole 26 which passes through the aluminum base 9 (and, which has a larger diameter than the through hole 24). Therefore, the heating element 19 is placed so as to avoid projection regions of the through holes 26 having a larger diameter.

c) Next, a method of producing the electrostatic chuck 1 of the embodiment will be described with reference to FIG. 5.

(1) As starting materials, 1 wt. % of MgO, 1 wt. % of CaO, and 6 wt. % of $SiO_2$ are mixed with 92 wt. % of alumina powder which is a principal component. The mixture powder is wet-milled with a ball mill for 50 to 80 hours, and then dehydrated and dried.

(2) Next, to the powder are added 3 wt. % of methacrylic acid isobutyl ester, 3 wt. % of butyl ester, 1 wt. % of nitrocellulose, and 0.5 wt. % of dioctyl phthalate, and, as solvents, trichloroethylene and n-butanol are added. A mixing operation is conducted using a ball mill to form a fluid slurry.

(3) Next, the slurry is subjected to reduced-pressure defoaming, and then poured out in a flat shape to be gradually cooled, thereby releasing the solvents to form first to fifth alumina green sheets 51, 53, 55, 57 and 59 having a thickness of 0.8 mm.

In each of the first to fifth alumina green sheets 51 to 59, through holes 61, 63, 65, 67 and 69 for forming the cooling gas flow paths 25 are opened at six positions. In each of the third to fifth alumina green sheets 55 to 59, through holes 75, 77 and 79 for forming the concave portions 29, 31 for the internal electrodes 15, 17 are opened at two places. In the fifth alumina green sheet 59, a through hole 81 for forming the concave portions 27, 28 for the heating element 19 is opened at two places.

(4) Furthermore, tungsten powder is added to the above-mentioned starting material powder for an alumina green sheet. The mixture is made into slurry by a similar method as described above to form a metallizing ink.

(5) Then, using the metallizing ink, conductive patterns 71, 73 (indicated by the hatching lines in the figure) for the internal electrodes 15, 17 are printed on the second alumina green sheet 53 by a known screen printing method.

(6) Using a well-known tungsten paste, a conductive pattern for the heating element 19 is printed on the fourth alumina green sheet 57 by a known screen printing method (as shown in FIG. 4).

(7) Next, the first to fifth alumina green sheets 51 to 59 are positioned so that the corresponding through holes coincide with one another, and then thermocompression bonded to one another, thereby forming a laminated sheet having a total thickness of about 5 mm.

The internal electrodes 15, 17 and the heating element 19 are drawn out through the vias 45, 46, 48 (See FIG. 2) to the rear faces of the alumina green sheets 53, 57, and as required connected to the conductive patterns so as to be exposed from the concave portions 27, 29 and 31.

(8) Next, the thermocompression-bonded laminated sheet is cut into a predetermined disk-like shape (for example, a disk-like shape of 8-inch size).

(9) Next, the cut sheet is fired at 1,400 to 1,600° C. in a reducing atmosphere. As result of the firing, the dimension thereof is reduced by about 20%, and hence the fired ceramic body 7 has a thickness of about 4 mm.

(10) After the firing, the total thickness of the ceramic body 7 is reduced to 3 mm by polishing, and processed so that the flatness of the chuck face 3 is 30 μm or smaller.

(11) Next, the metallization layers 41, 51, 53 are formed on the conductive patterns exposed from the concave portions 27, 29 and 31, and the vias, and nickel plating is applied to the metallization layers 41, 51, 53.

(12) Next, the internal connecting terminals 39, 47, 49 are brazed or soldered, to thereby complete the ceramic body 7.

(13) On the other hand, separately from the above-mentioned steps of producing the ceramic body 7, the aluminum base 9 is produced by well-known production steps, and processed into the above-mentioned predetermined dimension and shape (disk-like shape).

(14) Then, the ceramic body 7 and the aluminum base 9 are bonded together by a silicone resin so as to be integrated with one another. As a result, the electrostatic chuck 1 is completed.

d) Next, effects of the embodiment will be described.

In the electrostatic chuck 1 of the embodiment, the heating element 19 is arranged so as to avoid the projection regions T which are formed by projecting the through holes 33, 34, 35, 37 toward the ceramic body 7, and hence the temperature of the ceramic body 7 in the portions (projection regions T) corresponding to the through holes 33, 34, 35, 37 is not excessively raised.

As mentioned above, in order to instantaneously change the temperature of the ceramic body 7, the ceramic body 7 generates heat and at the same time the aluminum base 9 is cooled. In this case, during an etching process the heat of the ceramic body 7 in the through holes 33, 34, 35, 37 where the aluminum base 9 is not in direct contact with the ceramic body 7 is hardly transmitted toward the aluminum base 9, and hence the local temperature of the ceramic body 7 in the projection regions T of the through holes 33, 34, 35, 37 is easily raised. In the embodiment, by contrast, the heating element 19 is not placed in the projection regions T of the through holes 33, 34, 35, 37, and therefore the temperature of the projection regions is raised to a lesser extent.

Therefore, the temperature of the ceramic body 7 in the projection regions T of the through holes 33, 34, 35, 37 is not locally raised, and hence the temperature distribution in the ceramic body 7 can be made uniform. As a result, the entire semiconductor wafer 5 can be uniformly heated, and processing accuracy and the like of the semiconductor wafer 5 are advantageously improved.

In the embodiment, particularly, the heating element 19 is arranged so as to be separated from the projection regions T by 1 mm or more. Hence, the temperature distribution in the ceramic body 9 can preferably be made more uniform as compared to the case where the heating element 19 is arranged so as to simply avoid the projection regions T.

In the embodiment, the heating element 19 in the vicinity of the projection regions T is bent into a substantially U-like shape. According to this configuration, without densely wiring the heating element 19, the heating element 19 can be arranged so as to avoid the projection regions T, and so as to be absent in a spot-like manner. Therefore, the temperature distribution in the semiconductor wafer 5 can be further made more uniform.

Embodiment 2

Next, Embodiment 2 will be described. A description of components which are the same as those of Embodiment 1 is omitted.

Figure 6:
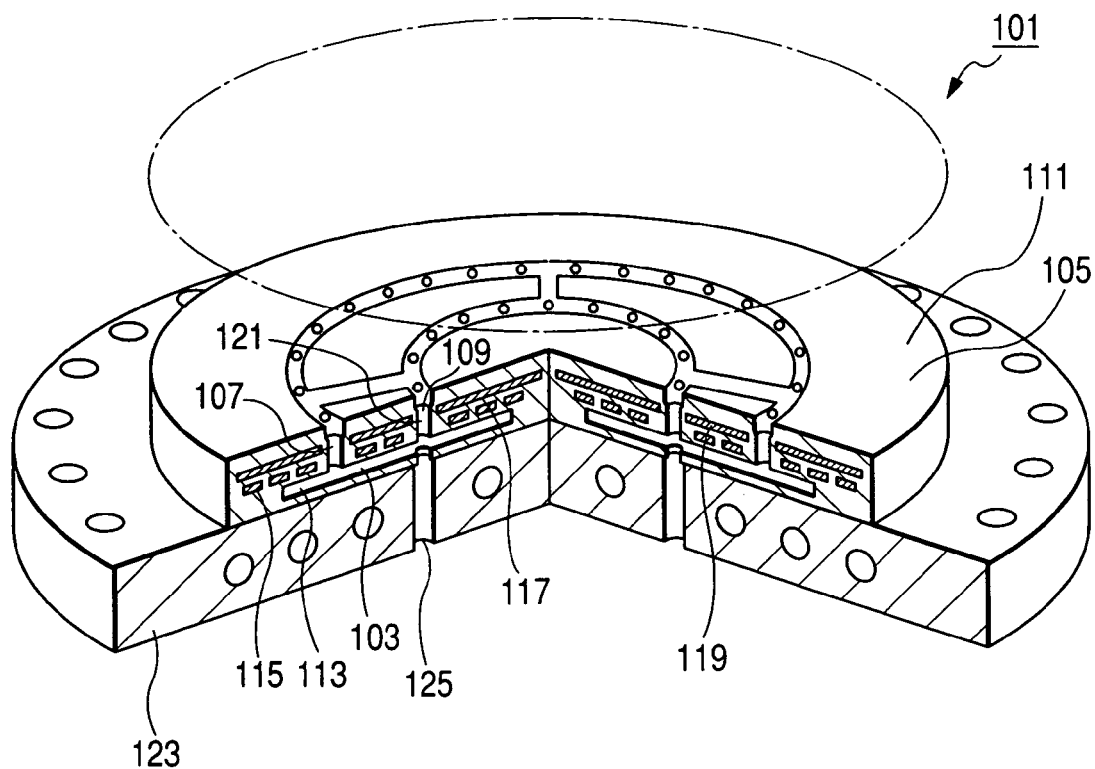
FIG. 6 is a partial cutaway perspective view of an electrostatic chuck of Embodiment 2.

As shown in FIG. 6, an electrostatic chuck 101 of the embodiment is basically configured in the same manner as Embodiment 1 described above, but different therefrom in the shape of a cooling gas flow path 103.

In the embodiment, the cooling gas flow path 103 comprises not only flow paths 107, 109 which extend in the thickness direction of a ceramic body 105, but also flow paths 113 which extend in parallel with a chuck face 111 (in the lateral direction in the figure).

A heating element 115 is placed above the cooling gas flow paths 113 which extend laterally, and internal electrodes 117, 119 are placed above the heating element 115.

In the cooling gas flow path 103, each of the flow paths 109 which pass through the ceramic body 105 in the thickness direction is configured by a through hole 121 which passes through the ceramic body 105, and a through hole 125 (having a larger diameter than the through hole 121) which passes through an aluminum base 123.

In the same manner as Embodiment 1, therefore, the heating element 115 is placed so as to avoid projection regions of the through holes 125 having a larger diameter.

Figure 7:
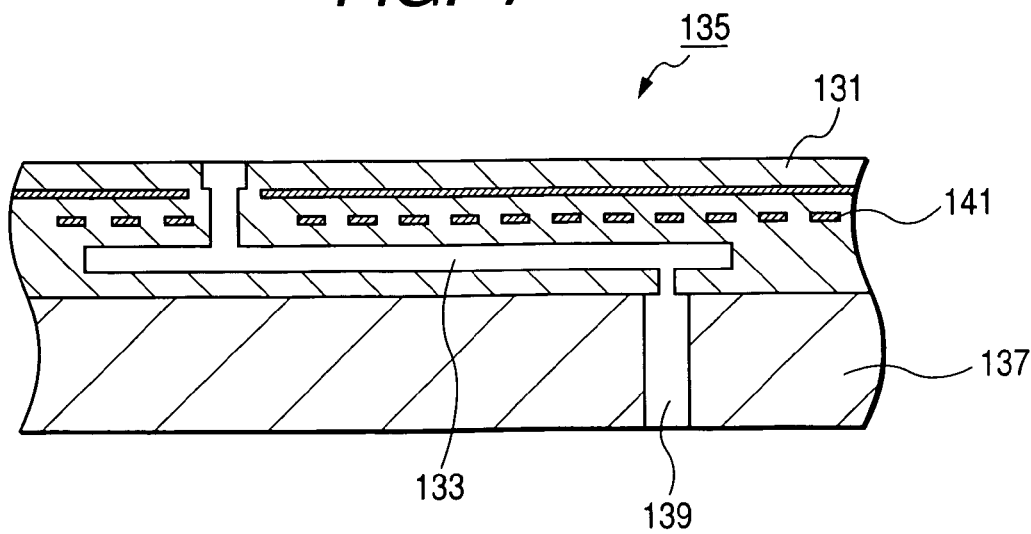
FIG. 7 is a longitudinal section view of another electrostatic chuck.

As shown in FIG. 7, a cooling gas flow path 133 may be bent inside a ceramic body 131, and may not pass through an electrostatic chuck 135 in the thickness direction (linearly). Also in this case, a heating element 141 is similarly arranged so as to avoid upward projection regions (projected toward the ceramic-body 131) of through holes 139 of an aluminum base 137.

The embodiment attains the same effects as those of Embodiment 1.

Embodiment 3

Next, Embodiment 3 will be described. The description of components which are the same as those of Embodiment 1 is omitted.

Figure 8A:
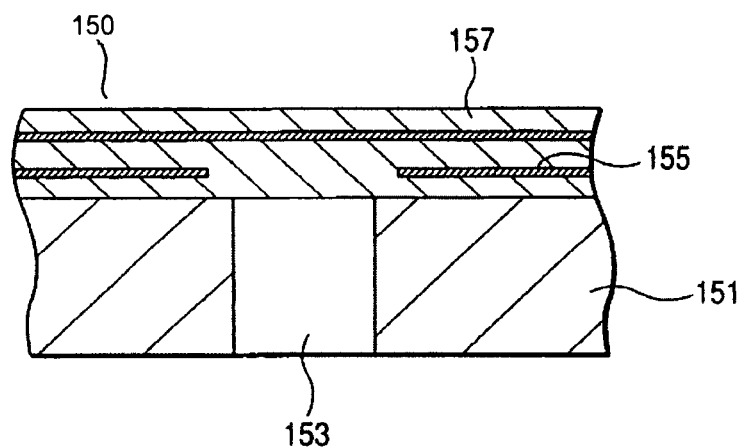
FIGS. 8A and 8B show enlarged main portions of an electrostatic chuck of Embodiment 3, where
Figure 8B:
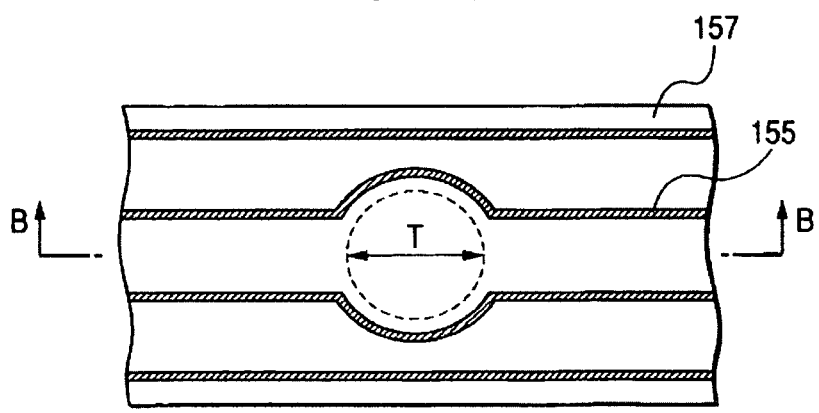

In an electrostatic chuck 150 of the embodiment, as shown in FIGS. 8A and 8B, a heating element 155 is arranged so as to avoid a projection region T (or a large projection region DT) corresponding to through holes 153 of an aluminum base 151.

In the case where, when the heating element 155 is placed in parallel (with another heating element 155), the heating element crosses the projection region T, the heating element 155 is bendingly placed in a curved shape so as to travel around the projection region T, or arranged to be concave with respect to the projection region T.

Also according to this configuration, it is possible to attain the above-described effect in which the temperature distribution in the ceramic body 157 is made uniform.

Embodiment 4

Next, Embodiment 4 will be described. The description of components which are the same as those of Embodiment 1 is omitted.

Figure 9:
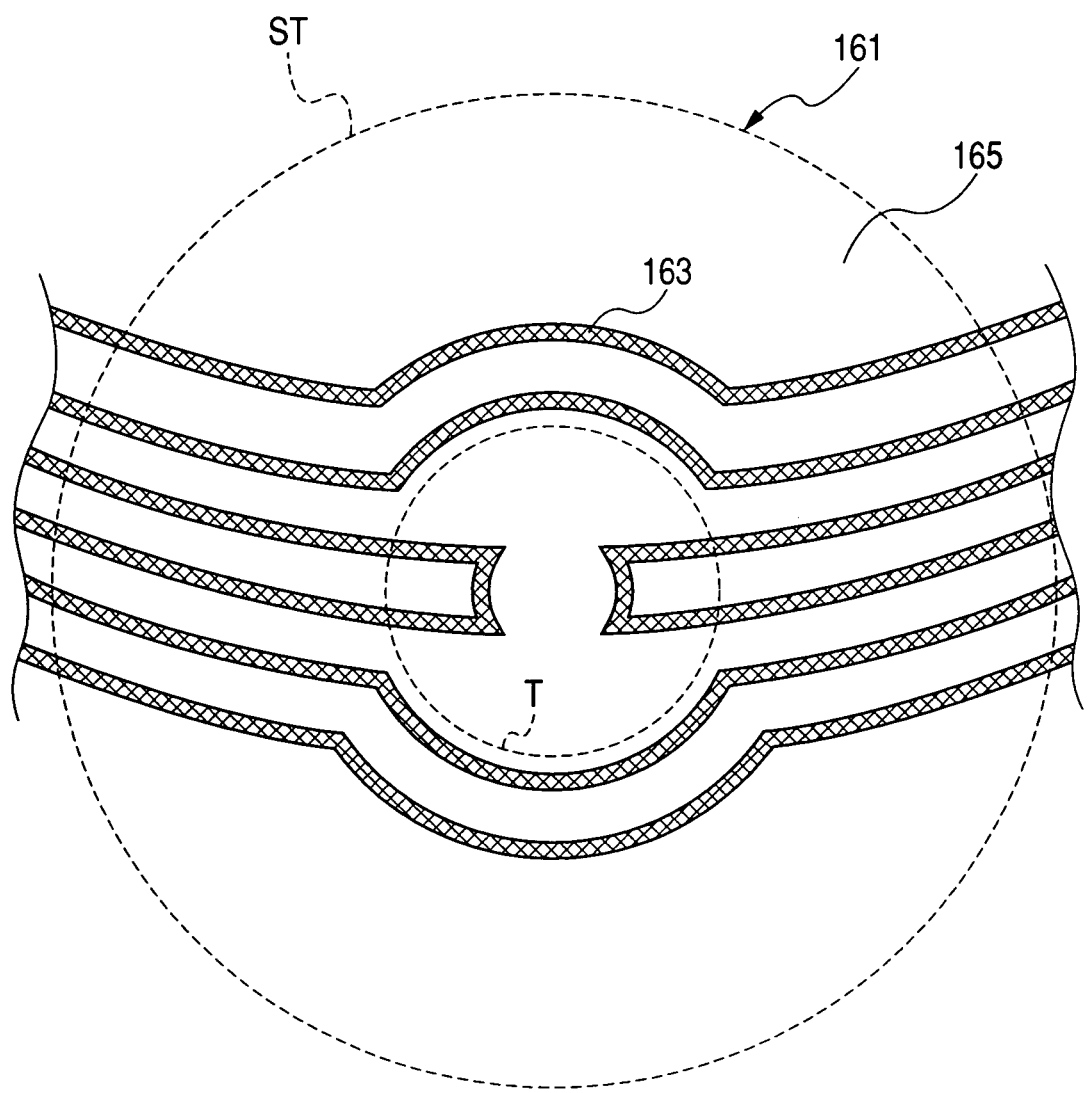
FIG. 9 is a diagram showing a planar arrangement of a heating element and the like in an electrostatic chuck of Embodiment 4.
Figure 10A:
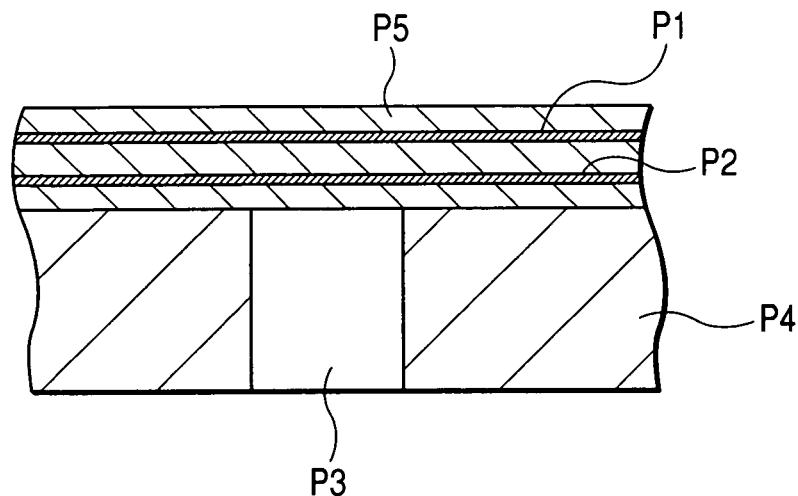
FIGS. 10A and 10B are diagrams illustrating the conventional art.
Figure 10B:
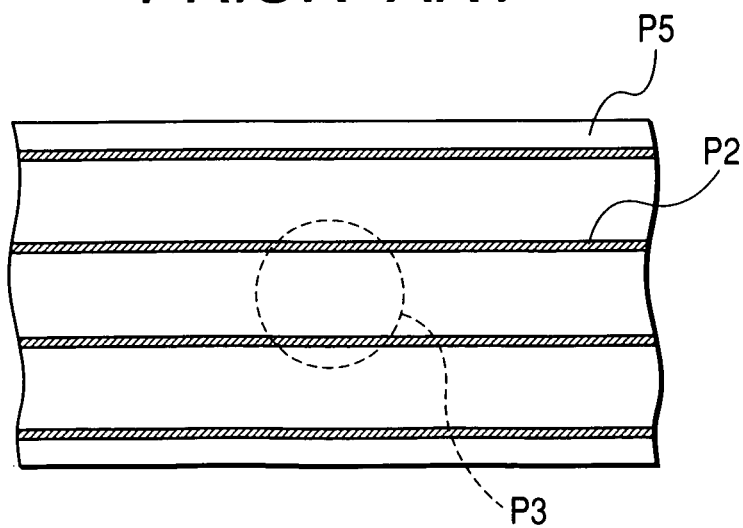

As shown in FIG. 9, an electrostatic chuck 161 of the embodiment is basically configured in the same manner as Embodiment 1 described above, but different therefrom in the position where a heating element 163 is arranged.

In the embodiment, the heating element 163 is also formed in the projection region T, but set so that the temperature of a ceramic body 165 in the projection region T is not excessively raised.

Specifically, the heating element 163 is formed so that, in the case where a circular projection region T having a diameter of 1 mm is differentiated from an annular outer region ST having an outer diameter of 3 mm (determined by magnifying the projection region at a similarity ratio of three while setting the areal center of gravity of the projection region T as the center of similarity, but excluding the interior of the projection region T), the heating value per unit area in the projection region T is 50% or less (for example, 45%) of the heating value per unit area in the outer region ST.

Namely, in the projection region T and the outer region ST, the heating element 163 is formed of substantially the same material (several tenths of a percent of ceramic is added to tungsten), thickness (20 μm), and width (1.5 mm), and hence the area of the heating element 163 per unit area in the projection region T is set to be 50% or less of the area of the heating element per unit area in the outer region ST.

This embodiment also attains the same effects as those of Embodiment 1.

It is a matter of course that the invention is not restricted to the above-described embodiments, and may be practiced in various ways without departing from the spirit and scope of the invention.

(1) For example, the invention is not restricted to a bipolar electrostatic chuck such as that illustrated in Embodiment 1, and can also be applied to a monopolar electrostatic chuck.

(2) A tunnel through which a refrigerant flows may be disposed in the aluminum base. Alternatively (or in addition to this), a tunnel through which a heating medium flows may be disposed in the aluminum base.

(3) In Embodiment 1, the cooling gas flow paths are used as through holes into which lift pins are to be inserted. The invention may also be applied to the case of a through hole dedicated for a lift pin. In a through hole for a lift pin, usually, the diameter of the through hole on the side of the aluminum base is larger than that of the through hole on the side of the ceramic body. Therefore, the heating element is arranged so as to avoid the projection region of the through hole on the side of the aluminum base.

(4) In Embodiment 1, a single spiral heating element is formed. Alternatively, two or more heating elements may be formed so as to be distributed in an inner portion (close to the central axis) and the outer portion of the base. For example, an inner heating element having a spiral shape or the like in the same manner as Embodiment 1 may be formed in the central portion of the base, and an outer heating element having an annular shape, a spiral shape, or the like may be formed on the outer portion (on the outer circumferential portion) of the inner heating element so as to extend around the circumference of the inner heating element. According to this configuration, ON/OFF operations and temperature controls on the inner and outer heating elements can be carried out independently.

This application is based on Japanese Patent application JP 2005-104520, filed Mar. 31, 2005, the entire content of which is hereby incorporated by reference, the same as if set forth at length.

What is claimed is:

1. An electrostatic chuck comprising:

a metal base having at least one through hole;

a ceramic body covering said through hole;

a suction electrode provided in said ceramic body; and a heating element provided in said ceramic body, wherein a heating value per unit area in a projection region of each of said at least one through hole is 50% or less of a heating value per unit area in an outer region, wherein said projection region is a region defined by projecting said through hole toward said ceramic body, and said outer region is a region determined by magnifying said projection region at a similarity ratio of three while setting an areal center of gravity of said projection region as a center of similarity, but excluding an interior of said projection region and wherein a lower surface of said ceramic body covers said at least one through hole and said ceramic body comprises:

a concave portion formed in the lower surface of said ceramic body and in communication with said at least one through hole of said metal base, wherein an upper end of said concave portion is at a position that is lower than that of the heating element;

a metallization layer formed in said concave portion;

a conductive pattern connected to said metallization layer; and a via penetrating through a portion of said ceramic body and connecting said heating element and said conductive pattern.

2. The electrostatic chuck as claimed in claim 1, wherein said heating element is formed from substantially the same material, and has substantially the same thickness and substantially the same width in both said projection region and said outer region, and a per unit area of said heating element in the projection region of each of said at least one through hole is 50% or less of a per unit area of said heating element in said outer region.

3. An electrostatic chuck comprising:

a metal base having at least one through hole;

a ceramic body covering said through hole;

a suction electrode provided in said ceramic body; and a heating element provided in said ceramic body, wherein said heating element is not present in a projection region of each of said at least one through hole defined by projecting said through hole toward said ceramic body and wherein a lower surface of said ceramic body covers said at least one through hole and said ceramic body comprises:

a concave portion formed in the lower surface of said ceramic body and in communication with said at least one though hole of said metal base, wherein an upper end of said concave portion is at a position that is lower than that of the heating element;

a metallization layer formed in said concave portion;

a conductive pattern connected to said metallization layer, and a via penetrating through a portion of said ceramic body and connecting said heating element and said conductive pattern.

4. The electrostatic chuck as claimed in claim 1, wherein said heating element linearly extends in a lateral direction, said heating element in the vicinity of said projection region has a substantially U-like shape, and a convex side of the U-like shape faces said projection region.

5. The electrostatic chuck as claimed in claim 3, wherein said heating element linearly extends in a lateral direction, said heating element in the vicinity of said projection region has a substantially U-like shape, and a convex side of the U-like shape faces said projection region.

6. The electrostatic chuck as claimed in claim 1, wherein said heating element is spaced apart from said projection region by 1 mm or more.

7. The electrostatic chuck as claimed in claim 3, wherein said heating element is spaced apart from said projection region by 1 mm or more.

8. The electrostatic chuck as claimed in claim 1, wherein said ceramic body is integrated with said metal base.

9. The electrostatic chuck as claimed in claim 3, wherein said ceramic body is integrated with said metal base.

10. The electrostatic chuck as claimed in claim 1, wherein said ceramic body comprises alumina.

11. The electrostatic chuck as claimed in claim 3, wherein said ceramic body comprises alumina.

12. The electrostatic chuck as claimed in claim 1, wherein said at least one through hole of said metal base has an inner diameter larger than an inner diameter of said concave portion of said ceramic body.

13. The electrostatic chuck as claimed in claim 3, wherein said at least one through hole of said metal base has an inner diameter larger than an inner diameter of said concave portion of said ceramic body.

14. The electrostatic chuck as claimed in claim 1, wherein said concave portion is a columnar concave portion having a central axis aligned with said through hole.

15. The electrostatic chuck as claimed in claim 3, wherein said concave portion is a columnar concave portion having a central axis aligned with said through hole.

* * * * *